United States Patent
Patterson et al.

(10) Patent No.: US 6,653,957 B1
(45) Date of Patent: Nov. 25, 2003

(54) SERDES COOPERATES WITH THE BOUNDARY SCAN TEST TECHNIQUE

(75) Inventors: Sylvia Patterson, Ft Collins, CO (US); Jeff Rearick, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/266,283

(22) Filed: Oct. 8, 2002

(51) Int. Cl.[7] .............................................. H03M 13/00
(52) U.S. Cl. .......................... 341/100; 341/55; 341/58; 324/765; 714/729
(58) Field of Search ............................. 341/58, 59, 100, 341/101, 68, 69, 55; 714/727, 728, 729; 324/765

(56) References Cited

U.S. PATENT DOCUMENTS

| | | | | |
|---|---|---|---|---|
| 5,598,541 A | * | 1/1997 | Malladi | 710/106 |
| 2002/0170011 A1 | * | 11/2002 | Lai et al. | 714/727 |
| 2003/0046015 A1 | * | 3/2003 | Gotoh et al. | 702/117 |

* cited by examiner

*Primary Examiner*—Howard L. Williams
(74) *Attorney, Agent, or Firm*—Edward L. Miller (57) ABSTRACT

Improvement in the transmission of Boundary Scan Test mode data may be achieved through the assignment of boundary scan test mode traffic to selected bit patterns that facilitate clock recovery and frame alignment in the serial channel. The encoding of boundary scan test traffic as such may be achieved through either multiplexed transmission to the serializer/deserializer (SERDES) alongside a regular channel encoder or incorporated into the channel encoder.

9 Claims, 4 Drawing Sheets

SERDES COOPERATES WITH THE BOUNDARY SCAN TEST TECHNIQUE

BACKGROUND OF THE INVENTION

A SERDES (an acronym standing for SERializer/ DESerializer) is a component in a digital communications path that converts data from a multi-bit parallel channel into equivalent data that is then applied to a higher speed serial channel. Typically, the communications path is bi-directional, and to accommodate that a SERDES also converts data from the serial channel into equivalent data that is then applied to the parallel channel. Multi-bit parallel channels (as found in parallel bus architectures) often present performance difficulties when operated at high speeds over long distances. For example, there may be skew between the bits. A serial channel is often easier to operate, even at much higher speeds. A common use of SERDES circuits then, is to use them in pairs, one SERDES at each end of a "long" communications path that is parallel at each end, but serial in-between.

So, for example, a high speed interconnecting serial channel might operate at 2.5 GHz and be a differentially driven pair of transmission lines, or a fiber optic link, while the two parallel ports might be eight bits wide with a word rate of 250 MHZ. Viewed from afar, the SERDES is part of a (transparent) SERDES to SERDES connection that forms a (possibly long) eight bit parallel path clocked at 250 MHZ. (It will be noted that the information, or overall bit rate, in the interconnecting serial channel is higher than that for the parallel data being transported. Some of that extra capacity is used to facilitate serial channel "housekeeping" and will be of considerable interest in due course.) A typical application for such a pair of SERDES circuits is as transmitting and receiving mechanisms for high speed data paths between individual ICs (Integrated Circuits) located on the same printed circuit board, or perhaps located on different printed circuit boards within the same chassis and interconnected through a backplane. (There are, of course, other applications for SERDES circuits, but these are the ones of our immediate interest.) In such an arrangement a pair of SERDES circuits forms an essentially transparent mechanism that transports eight-bit words from one location (an IC or other environment) to another, as if accomplished by a bus, but without certain practical difficulties (e.g. bit-to-bit skew) that beset a bus operating at high frequencies.

For various reasons the high speed serial data (one bit wide) is sent as a differential pair. These reasons include speed of detection at the receiving end (twice the dv/dt is experienced by the differential receiver), common mode rejection by the receiver of noise induced in both sides of the signal, and noise generation avoidance through zero net change in currents flowing through ground and the power supply. What is more, each signal of the differential pair is often AC coupled. This allows SERDES of different manufacture or incompatible semiconductor families to cooperate. Typically, 4.7 uF capacitors are disposed on the PC board and are in series with the differentially driven transmission lines that couple the serial ports of the SERDES.

We have already indicated that the serial and parallel paths do not have the same bit rates: in the example set out above, eight times 250 M is not 2.5 G; there is a ten-to-one difference, instead of an eight-to-one difference. The difference in bit rates is accounted for by the use of a mapping that uniquely associates each of the possible two hundred and fifty-six eight-bit parallel bit patterns (it will be convenient to refer to these as "characters"—even if those bit patterns do not represent familiar alpha-numeric or typographical symbols) with a different serial pattern of ten bits, of which there are one thousand twenty-four. The mapping is an industry standard informally-called 8b10b, and the "surplus" seven hundred sixty-eight serial characters are used in various ways, among which is the definition of an entire class of control characters used for supervisory purposes in managing the operation of the serial channel. It will be noted that the mapping mechanism needs to be bi-directional, since a receiving SERDES needs to convert the ten-bit serial characters back into eight-bit parallel characters. At the block diagram level this mapping mechanism turns into an 8b10b encoder and a companion 10b8b decoder.

An important aspect of the 8b10b mapping is that it allocates to each pair of eight-bit parallel characters a pair of ten-bit serial patterns that, over the pair, has the same number of ones and zeros. Such balance is needed to keep the AC coupling in the high speed serial path from accumulating a charge (blocking) and subsequently attenuating the amplitude of the transmitted signal. Otherwise, there would exist sequences of eight bit data that would produce corresponding ten-bit sequences that were unbalanced, which if they are long enough, would charge the coupling capacitors completely, resulting in a serial channel malfunction.

Unfortunately, there are only two hundred fifty-two ten-bit characters that have five ones and five zeros, which means that a simple 8b10b scheme would have four eight-bit parallel characters that are associated with unbalanced serial characters. Long input sequences involving those particular parallel characters would be untenable, so the actual 8b10b scheme is "context sensitive" and alters the mapping, as needed, on alternate characters such that serial side is always balanced over at most twenty bits (corresponding to two input characters). This involves what is called a "disparity bit" and is a known mechanism. A related issue is the fact that no clock signal is explicitly sent from the transmitting SERDES to the receiving SERDES. Instead, the receiving SERDES performs clock recovery. While AC coupling requires balance, clock recovery benefits from regularly distributed transitions in the data, with the implication that some mappings from eight bits to ten bits are less desirable than others.

Operating in cooperation with the basic 8b10b encoding and 10b8b decoding is the coding and decoding of ten-bit framing characters that are periodically inserted in the serial traffic as part of an established SERDES protocol. This mechanism (packets separated by framing characters), in conjunction with initial training sequences and the practice of clock recovery, allow the receiving SERDES to "sync up" on the transmitting SERDES; both a frequency locked-loop and a phase-locked loop are involved. The tasks of generating and of recognizing such control characters are facilitated by defining the often used serial channel control characters (of which the "comma" K28.5 is one member of that family of characters) as some consecutive number of ones followed by some consecutive number of zeros, including the one's complement of those patterns. The patterns selected for this duty are five consecutive ones followed immediately by two consecutive zeros, and five consecutive zeros followed immediately by two consecutive ones. It turns out that this can be accomplished by assigning such meanings to otherwise unused "surplus" codes in the 8b10b scheme.

Now let us consider the issue of testability for large and complex printed circuit board assemblies having many ICs, such as the router cards and line cards found in industrial strength internet routers. It will be appreciated that some manufacturer's versions of those include pairs of SERDES, as described above.

A venerable prior art method of testing installed ICs involves a "bed of nails" that makes electrical contact between a test apparatus and useful locations upon a DUT (Device Under Test), which in this case is a printed circuit board assembly. Further connections are made to the lands of the edge connector(s) and any cables attached to the board. The test apparatus applies power, stimulus, and makes measurements. However, trends occurring over the last few decades have limited the applicability of such testing. These include high numbers of tiny traces, traces on interior layers of multi-layer boards, and high frequencies of operation that cause circuits to react unfavorably to the parasitic impedances added by the test fixture. And while testing with a bed of nails remains a staple in the electronics industry for a certain class of printed circuit board assemblies, another approach has recently emerged to aid in the testing of, and diagnosis of failures in, large complex printed circuit board assemblies. It goes by the name "boundary scan" and amounts to the inclusion within ICs of a limited, but quite useful, amount of internal testability circuitry that can be exercised by an external tester.

The boundary scan technique was developed by a group of interested manufacturers that formed a group called JTAG (Joint Test Action Group). This effort eventually resulted in an industry standard formalized as IEEE 1149.1, which runs to well over two hundred pages. We are quite interested in the boundary scan technique that is set out therein, and shall attempt to summarize certain pertinent concepts in the next few paragraphs. At that point we shall be in a position to appreciate "what the problem is" and get on with a summary and a description of the invention. But for now, just as we did for SERDES circuits above, we must engage in a brief digression about the nature of the boundary scan technique.

The fundamental idea of boundary scan is to be able to put an IC into a mode where its external connections (those at the "boundary") are "disconnected" from their normal core IC circuitry, and are instead coupled to the aforementioned internal test circuitry. That internal test circuitry includes a collection of boundary scan registers and a supervisory controller operated through a TAP (Test Access Port) having five electrical signals. Associated with each IC pin that is to be included in the boundary scan tests (but excluding the pins for the five signals of the TAP) are one, two or three one-bit registers located within that IC. The number of such registers depends upon the functionality of the associated pin: input-only or output-only (one), tri-stated output (two), or bidirectional (three). According to the circumstances, one of these registers indicates if the pin is to be active (as either a driver or a receiver) or if it is instead to be neither (tri-stated), one indicates output data to be driven, and the other indicates input data received. This selective coupling is accomplished by MUXs (multiplexers) between an IC pin and its respective sets of registers (for boundary scan testing) and its respective core IC circuitry (for normal operation). The boundary scan registers and these MUXs are coupled to, and are controlled by, a small finite state machine of sixteen states that requires about two hundred gates to implement. The boundary scan state machine gets its orders from, and reports its results to, external test apparatus that communicates with the finite state machine via the five signals of the TAP.

The five signals of the TAP interface are: TDI (Test Data In), TDO (Test Data Out), TCK (Test Clock), TMS (Test Mode Select), and TRST (Test Reset). In the typical case where there are several ICs on the circuit board, TCK (and perhaps TRST) can be signals common to all of the ICs through a single instance of each signal. There is defined a way where TMS essentially functions to perform an "enable boundary scan for this chip" operation that provides unit selection and substitutes for addressability. That, in conjunction with a pass-through (internally from TDI to TDO, via a bypass scan register) allows the daisy chaining of TDO from one IC to TDI of the next, and so on, so that the number of added pins to the circuit board needed for support of the boundary scan technique does not swamp its usefulness, even for large numbers of ICs on the board. By using the unit selection ability and the loop formed by the daisy chain, the following types of test operations can be performed under the aegis of the external test apparatus.

Within a given IC, the status of each pin can be specified. If a pin is to be internally driven, a logic one or logic zero can be specified. If a pin is to be externally driven, then the received value can be latched. A pin can also be tri-stated. The value of all pins can be reported to the external test apparatus by a serial shifting out onto TDO of the received value registers. An internal loop-back arrangement allows the boundary scan circuitry to measure, as in reception, its own attempts to drive a pin, which is also reported. In this connection, the sensing of an output pin is performed one driver stage back from the actual ohmic connection to the PC board, so that, say, a short to ground on that line will be sufficiently decoupled that it will not thwart a correct measurement of the attempt to drive. The idea is that we want a rough preliminary assessment of the health of the drivers and receivers of the IC, and are patient enough to wait to discover such an external short with subsequent testing performed in due course.

Once we are satisfied that all the ICs have operational boundary scan abilities, we can then use those to determine if the interconnecting traces between ICs are free of faults. This is done by telling the boundary scan mechanism in one IC to drive with specified patterns of ones and zeros those lines leading to other ICs and then having those ICs report the results. By properly selecting the values driven, traces (including their attendant solder joints) can be tested for continuity, shorts to ground or $V_{DD}$, and shorts to each other. Given the high density of small surface mount parts on today's PC boards, that some PC boards are huge (a square foot is not uncommon), the frequent use of multi-layer techniques and inaccessible solder joints such as in ball grid arrays, such verification of proper connectivity is no small matter.

Once proper connectivity has been established, the boundary scan mechanisms can be turned off and further functional testing performed using other means, with the expectation that a correct diagnosis of a failure will now be considerably easier to perform.

Those concerned with boundary scan operation tend to think of it as if it were DC testing. To be sure, if one were to put a scope probe on an IC pin, a changing waveform would often be observed. But in reality, an IC pin is statically driven with a particular logic state (a DC event) until changed in accordance with the next step in a test algorithm. And while in principle, that type of boundary scan operation is perhaps more aptly termed "static" boundary scan, "DC boundary scan" has instead become the customary accepted terminology. Accordingly, we shall from time to time find it convenient to refer to "DC" boundary scan when appropriate.

The fact that changes occur frequently with DC boundary scan must not be confused with genuine AC operation, particularly since there has recently emerged an "AC boundary scan" technique. What distinguishes it is that the driver circuitry associated with its boundary scan operation generates transitions and that the associated receiver circuitry is responsive to those transitions. The idea is to tolerate AC coupling in the path between the driver and the receiver. Typically, some clock signal is used to produce the transmitted transitions and a selected phase shift is applied to one of the transmit or receive processes to change the expected voltage level of the received result. In this way the AC boundary scan technique can verify that both logic ones and zeros can be exerted, even though there may be intervening AC coupling in the path between the pins being tested. It will be appreciated that the transition sensitive nature of AC boundary scan requires more involved circuitry, and is perhaps somewhat "fussy" and less reliable when compared to DC boundary scan.

And thus we come to two problems encountered when the boundary scan technique is to be applied to a SERDES, either as a stand-alone IC, or to one that is incorporated as an addition into an IC having some other principal function. The first problem is that the differential driver that drives the pair of transmission lines (or perhaps instead drives an optical source) operates at such a high frequency that it is generally not tolerable for there to be an intervening MUX that controls whether the differential driver drives data provided by the chip core or by the boundary scan mechanism, whether AC or DC. The relatively slow boundary scan mode of operation would likely work, but the very high speed path for data originating at the chip's core would be corrupted beyond usability. The second problem is the presence of AC coupling in the high speed path between SERDES of different ICs. This prevents a "DC" output stimulus from one SERDES from being a DC input stimulus to the other SERDES. That in turn prevents the PC board trace corresponding to that path from being tested via DC boundary scan. AC boundary scan is not appropriate either, owing to its use of the aforementioned MUX (the first problem).

Now, suppose a purveyor of fine SERDES circuits offers to fabricate ICs consisting of, or including, such SERDES for use in complex printed circuit board assemblies (e.g., router cards and line cards), perhaps assembled by a second party for use in an item sold to a third party. These SERDES may or may not use AC coupling in their interconnecting serial channel; if they do then that prevents use of DC boundary scan, while the need to use a MUX eliminates both AC and DC boundary scan, anyway. While the ICs at issue can be variously tested when they are made, but prior to installation, that does little toraid in the diagnosis of assembled printed circuit board assemblies that fail during their testing (conducted perhaps, in an altogether different factory). If the ICs at issue cannot perform a full boundary scan owing to an exemption for the serial channel of the SERDES section, then additional uncertainty is created during the testing and troubleshooting process. Such uncertainty has an economic cost, and is otherwise undesirable. It would thus be desirable if there were a convenient and cost effective way to allow a SERDES to participate in the DC boundary scan test techniques described by IEEE 1149.1.

SUMMARY OF THE INVENTION

The problem of implementing DC boundary scan for the interconnecting AC coupled serial channel between a source SERDES and a destination SERDES includes substituting, during a boundary scan test mode, selected test mode traffic in place of the normal mission mode traffic. During normal mission mode operation eight-bit parallel character mission mode information is replaced with corresponding conventional ten-bit parallel bit patterns by an 8b10b encoder. These ten-bit parallel patterns are serialized by a parallel-to-serial converter, sent over the serial link and received by a serial-to-parallel converter that produces a received ten-bit parallel code. The received ten-bit parallel codes are applied to an 10b8b decoder, from which the originally applied eight-bit mission mode characters are recovered. During the boundary scan test mode operation what corresponds to the mission mode's eight-bit parallel characters are signals originating in the boundary scan environment representing the desire to transmit a boundary scan DC value of one (a "BS1") or a boundary scan DC value of zero (a "BS0"). Ideally, the serialized bit patterns selected to represent BS1 and BS0 would be single characters that are frame alignment characters and that each contain an equal number of ones and zeros. Unfortunately, the 8b10b encoding scheme does not include such a combination. The serialized bit patterns sent over the serial link to represent BS1 and BS0 are each of twenty bits in length, as if they each had been represented by some respective pair of eight-bit parallel characters that were encoded into, and subsequently decoded from, a pair of ten-bit parallel bit patterns. Each of the pairs of ten-bit (serial or parallel) bit patterns involved in this boundary scan test mode operation are chosen to contain a frame alignment character and an associated disparity equalization character. This preserves DC line balance within the AC coupled serial channel, respects the disparity bit mechanism used by the SERDES, facilitates clock recovery and frame alignment, even for asynchronously transmitted BS1's and BS0's. If receiver tolerances for frame locking and disparity tolerance permitted it, single characters could represent BS1 and BS0. This is an area of operation not contemplated by the standards for SERDES circuits, and interoperability between products from different vendors could well be problematic. There is no such difficulty with the paired character technique, as it does conform to operation contemplated by the standard, even though its ultimate purpose is outside the scope of the standard.

In a first preferred implementation the existing 8b10b encoder of the source SERDES and the 10b8b decoder of the destination SERDES are left unaltered, but during boundary scan test mode operation they are disconnected from their respective parallel-to-serial and serial-to-parallel converters by respective source and destination MUX's controlled by a signal representing the mode of operation: mission mode or boundary scan test mode. During the boundary scan test mode operation an indicated BS1 or BS0 is encoded by separate circuitry into respective pairs, each of two consecutive ten-bit parallel words that are then applied by the source MUX to the native parallel-to-serial converter of the source SERDES. The resulting twenty-bit serial bit patterns are transmitted over the serial link to the native serial-to-parallel converter of the destination SERDES. The received pair of ten-bit parallel bit patterns are then routed by the destination MUX, not to the native 10b8b decoder, but instead to separate circuitry in the destination SERDES that decodes the received ten-bit parallel bit patterns into whichever one of BS1 or BS0 was originally sent. Signals representing this received information are then applied to appropriate associated boundary scan circuitry in the destination SERDES.

A second preferred implementation includes providing native 8b10b encoders and 10b8b decoders which directly recognize, in place of the MUX's of the first preferred implementation, that the boundary scan test mode is in effect. During the boundary scan test mode, but not during the mission mode, the 8b10b encoder in the source SERDES is additionally responsive to an indicated BS1 or BS0, and itself provides the associated twenty-bit parallel bit pattern, which is then serialized and transmitted in the normal manner. At the destination SERDES the received twenty-bit serial pattern is converted back to parallel and applied as consecutive words to the 10b8b decoder, which will output separate individual signals representing BS1 and BS0, in place of the normal eight-bit parallel characters of the mission mode. The signals representing BS1 and BS0 are then applied to appropriate associated boundary scan circuitry in the destination SERDES.

These solutions avoid placing MUX's in the sensitive high speed path of the serialized data. That allows normal data to be handled transparently and without corruption, while permitting the use of AC circumstances to substitute for DC conditions in the synthesis of a boundary scan operation.

DESCRIPTION OF A PREFERRED EMBODIMENT

Figure 1:
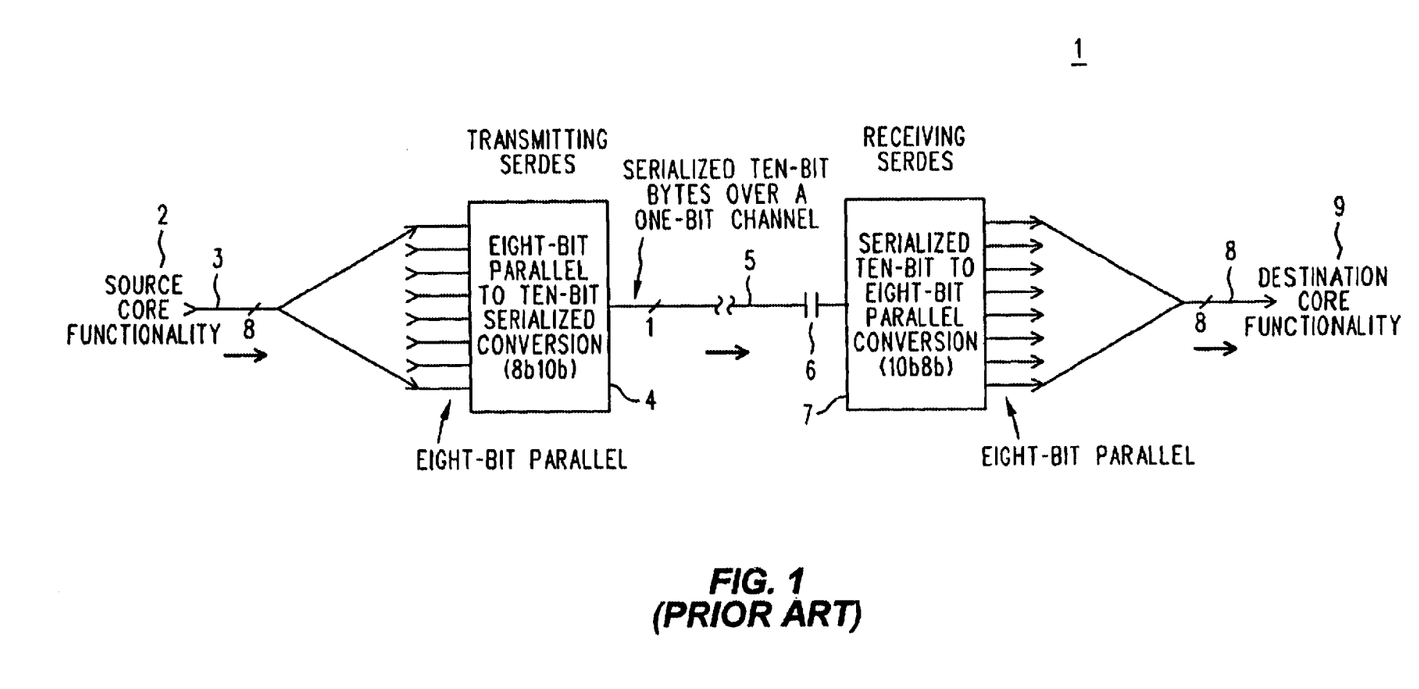
FIG. 1 is a simplified partial block diagram of a prior art technique for using a pair of SERDES circuits to establish AC coupled serial communication between two separated environments within a system, and which does not support the DC boundary scan test technique.

Refer now to FIG. 1, wherein is shown a simplified partial prior art block diagram 1 of a system using a pair of SERDES (4, 7) for high-speed communication between different system sections (2, 9) having core functionality and that need to communicate with each other. Accordingly, note that some Source Core Functionality 2 provides eight-bit traffic 3 that is applied to the parallel side of a transmitting SERDES 4 for outbound transmission over a one-bit serial path 5 to a receiving SERDES 7. Note also that the serial path 5 is AC coupled (coupling capacitance 6). The receiving SERDES 7 reconstitutes the original eight-bit traffic and applies those reconstituted bytes (8) to a Destination Core Functionality 9. The result is a transparent connection of eight-bit traffic between the two core functionalities, as if eight-bit traffic 3 and 8 were identically the same electrical entities. They are not, of course, the same electrical entities, but they are logically identical, even though the distance covered by path 5 may be a significant one that would otherwise impair genuine high-speed parallel transmission of the information. That distance might be just from one IC located at one place on a printed circuit board to another IC at a different location, or it might be from one circuit board to another via a backplane, or perhaps even a longer distance. What the two core functionalities are depends, of course, on the nature of the overall system, and is generally not of concern to us. Furthermore, the quantizing of the functional traffic into eight-bit bytes and the use of ten serial bits to represent a transmitted byte, are contingent on accepted standards for commercially available SERDES circuits. Other standards having different numbers for the serial and parallel bytes might someday emerge, and the invention would still be applicable.

In final reference to FIG. 1, note that although the serial path 5 is only one bit wide, it is almost certainly a differential path involving two complementary signals, each of which is carried by an associated transmission line (e.g., strip lines) having two conductors, and that coupling capacitance 6 is accordingly representative of a pair of such capacitances. Lastly, it will be noted that no boundary scan stuff has been included in this block diagram. That is because, for the reasons previously given, the prior art does not support either AC or DC boundary scan testing of an intervening serial path 5 between SERDES 4 and SERDES 7.

Figure 2:
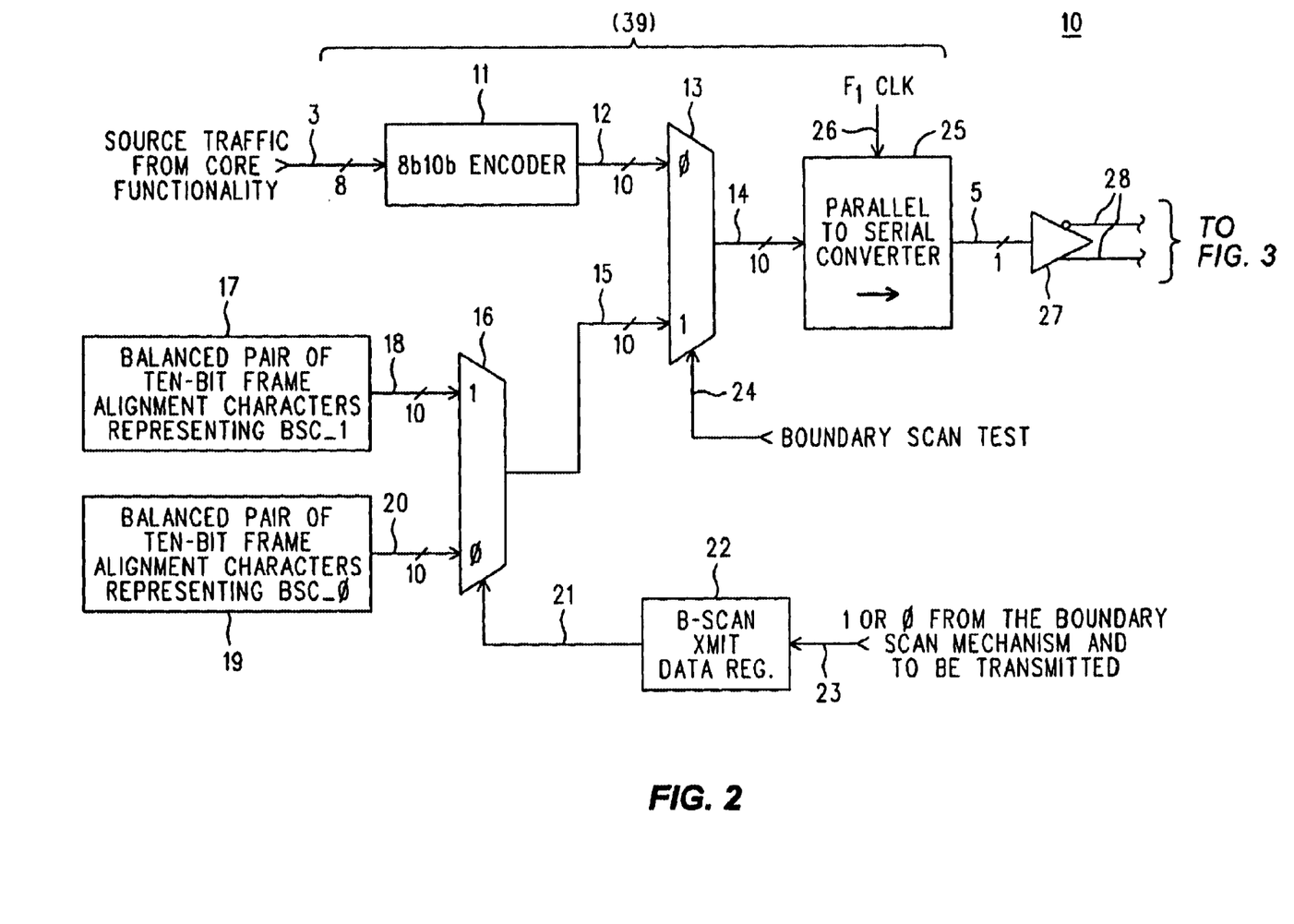
FIG. 2 is a simplified block diagram of how, in conjunction with FIG. 3, the transmitting SERDES of FIG. 1 may be modified to cooperate with the DC boundary scan test technique.

Refer now to FIG. 2, wherein is depicted a simplified partial block diagram 10 of how the SERDES 4 of FIG. 1 can be modified (39 in FIG. 2) to cooperate with the DC boundary scan test technique. As shown in the figure, eight-bit source traffic 3 from the Core Functionality (2 of FIG. 1) is applied to an 8b10b encoder 11, from whence it is (via MUX 13, as described below) applied to a Parallel To Serial Converter 25 for transmission to a receiving SERDES (30 and 33 in FIG. 3). Now, to say that the SERDES 4 in FIG. 1 is mainly an 8b10b Encoder driving a Parallel To Serial Converter is indeed quite a simplification, but for our present purpose that represents an adequate level of abstraction. Note again that MUX 13 has been interposed between the 8b10b Encoder 11. MUX 13 is responsive to a signal 24 BOUNDARY SCAN TEST, in part, by coupling the ten-bit parallel characters 12 from 8b10b Encoder 11 to the input 14 of the Parallel To Serial Converter 25 whenever the boundary scan test mode is not in effect (i.e., the signal BOUNDARY SCAN TEST 24 is false).

Figure 3:
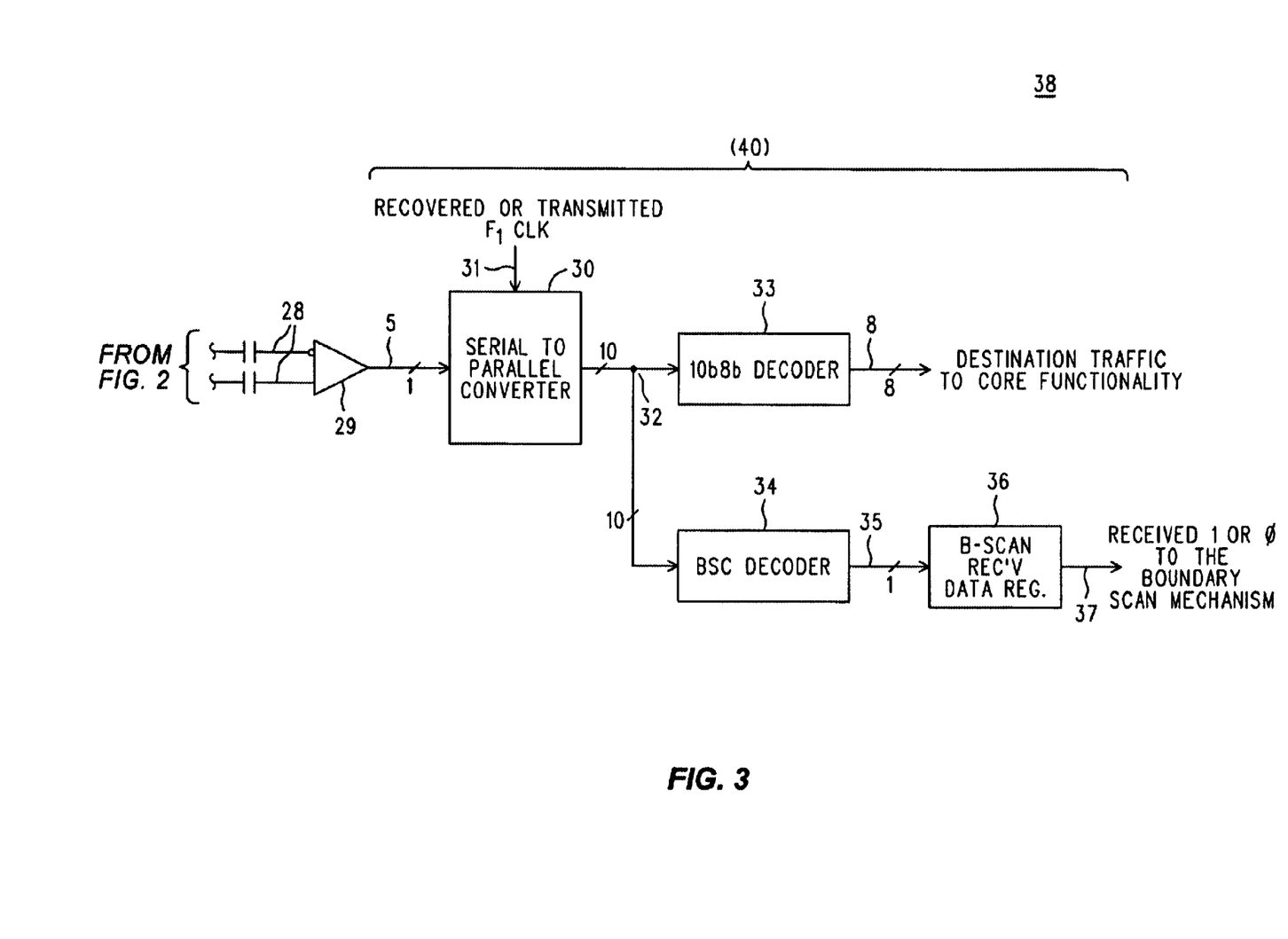
FIG. 3 is a simplified block diagram of how, in conjunction with FIG. 2, the receiving SERDES of FIG. 1 may be modified to cooperate with the DC boundary scan test technique.

Ten-bit parallel characters 14 that are applied to the Parallel To Serial Converter 25 are converted and each of their serialized counterparts 5 is applied to a differential driver 27 coupled to some form of transmission line(s) 28, the terminus of which is shown in FIG. 3. When those ten-bit parallel characters 14 originate with the 8b10b Encoder 11 we may say that the system is operating in its normal (non-test) mission mode. In a conventional SERDES there would be no need MUX 13 at that location. Mindful that we don't want to put a MUX on the other side of Converter 25, and also most certainly not at the transmission line side of driver 27, we note that in the arrangement of FIG. 2 the presence of MUX 13 does no harm during the normal mission mode, since: (A) It is a digital circuit located in an altogether digital environment; (B) It operates at a data rate one tenth that of the serial data stream 5; and, (C) Does not present a disturbing parasitic impedance to the high-speed driver 27 and its impedance controlled transmission line(s) 28.

During the boundary scan test mode the signal 24 is TRUE, causing MUX 13 to couple the Parallel To Serial Converter 25 to ten-bit parallel data 15 that originates from a mechanism responsive to activities occurring during the performance of a boundary scan test, rather than from the normal 8b10b Encoder 11. The Parallel To Serial Converter 25 does not know that this has been done, and continues to operate as usual.

The alternate ten-bit parallel data 15 will represent either a "BSC_1" (Boundary Scan Character One) or a "BSC_0" (Boundary Scan Character Zero), as selected by yet another MUX 16 in response to a signal 21 indicating the value stored in a B-Scan Transmit Data Register 22. The register 22 is loaded with a one or a zero according to whichever value the boundary scan test mechanism (not shown) indicates is to be the transmitted value. MUX 16 then selects between one pair of ten-bit parallel signals (17, 18) and another such pair (19, 20) as the pair of ten-bit parallel patterns to apply as signal 15 to MUX 13 (from which that signal then goes to on to become the signal 14 whose value is serially transmitted by the SERDES 39 at the rate set by the signal $F_1$ CLK 26.) Signal 18 is a pair of ten-bit parallel patterns having, over the complete pair, equal numbers of ones and zeros and that has been chosen to represent a BSC_1. (That is, it is at signal 5 a twenty-bit serial pattern representing a logic one during boundary scan testing, and a pattern which, as far as the rest of the SERDES is concerned, is a frame alignment character and a disparity equalization character.) In similar fashion, signal 20 is a different pair of ten-bit parallel (frame alignment/disparity equalization) patterns understood as a BSC_0. The bit patterns for signals 18 and 20 are respectively stored in, or are generated by, suitable circuitry 17 and 19 (e.g., registers of the read-only, read-write, or of the flash variety).

Before continuing, let us dwell for a moment on the nature of the ten-bit parallel patterns that are stored in, or produced by, circuits 17 and 19. We have already indicated that for a present day SERDES it is preferred that those patterns be pairs of frame alignment/disparity equalization characters, as this facilitates the ancillary housekeeping function of clock recovery, which is conventional and is performed by the balance of the SERDES mechanism. If the receiver tolerates it, then that preference can be relaxed to simply the use of one or more characters having a sufficient transition density. However, those various requirements might be waived if there were some other mechanism aside from the serial channel that provided the receiving SERDES with a suitable clock (i.e., some sort of separate clock channel that precluded the need for clock recovery from self clocking data). Next, if the serial channel were not AC coupled, then a build-up of charge in the coupling capacitor would not be an issue, and an equal number of ones and zeros within the pattern selected to represent a BSC_1 or a BSC_0 would not be required. In such a DC coupled case one could choose a frame alignment character, or not, as discussed immediately above. That is, if it were the case that clock recovery were not an issue and there were no AC coupling, then, as will become clear after FIG. 3 is discussed, just about any ten-bit parallel characters could be selected for use as BSC_1 and BSC_0, even if they already had an another assigned "regular character" meaning during mission mode operation.

In the case of a typical present day SERDES, however, there is no separate clock delivery mechanism, and it is quite possible, and even likely, that the serial channel is AC coupled. So we do want reliable clock recovery, even for BSC_1's and BSC_0's sent asynchronously at odd times, and we must guard against saturating the coupling mechanism. That means we need to send frame alignment characters (or provide sufficient transition density) and keep an equal number of ones and zeros in the serialized bit stream 28. Unfortunately, there are no individual frame alignment characters that meet both requirements. However, there are pairs of different characters that, as a consecutive pair, do have an equal number of ones and zeros. Among these pairs are frame alignment characters and their associated disparity equalization characters. Fortunately, one or both of these collections of will pairs satisfy the demands of the receiver (depending upon its tolerances). They will allow a slight temporary charge to accumulate, but so long as the amount of accumulated charge hovers about zero, that does no harm. This is why, in a preferred embodiment, we send selected pairs of frame alignment/disparity equalization characters to represent BSC and BSC_0. There are many such possible combinations possible within the IEEE 1149.1 standard. For example:

| BSC_0 | 111111 00<u>0</u>0 | (frame alignment char.) |
|---|---|---|
|  | 110011 00<u>0</u>0 | (disparity equalization char.) |
| BSC_1 | 000000 11<u>1</u>1 | (frame alignment char.) |
|  | 001100 11<u>1</u>1 | (disparity equalization char.) |

Note the underlined bit positions in the above patterns. There is a useful artifact of 8b10 encoding and the rules for detecting frame alignment characters that should be noted. A frame alignment character is indicated whenever at least five consecutive ones is followed immediately by at least three consecutive zeros, or at least five consecutive zeros is followed immediately by at least three consecutive ones. So, let us replicate the rule for detecting frame alignment characters as the rule for deciding that one of either BSC_1 or BSC_0 has been received. That would ordinarily allow us to sample the bits at the underlined positions. Note that for BSC_0 we would sample a ZERO, and that for BSC_1 we would sample a ONE. What is more, even if the clock recovery or existing frame alignment were off by a bit in either direction, the right result would still be obtained. This makes the recovery mechanism for boundary scan characters more robust than otherwise. This is useful, since it is probable that, in the case of a SERDES, boundary scan testing will be performed before the SERDES is "calibrated" to adjust receiver bit alignment. Such calibration assists in creating increased margins for the clock recovery process. An uncalibrated SERDES might not operate as reliably as desired; hence the usefulness of the above described redundancy in the patterns of the example.

It will be appreciated that the same considerations apply for both BSC_1 and BSC_0, and that serialized sequences of any multiple of ten bits may be used (i.e., not just pairs), subject to satisfying the various conditions set out above.

Refer now to FIG. 3, which is a simplified partial block diagram 38 depicting how a receiving SERDES 7 of FIG. 1 can be modified (40 in FIG. 3) to cooperate with the modified SERDES 39 of FIG. 2. The differentially driven serial lines 28 are coupled to a suitable receiver 29 and a serial bit pattern signal 5 is applied to a Serial To Parallel Converter 30 clocked by a clock signal $F_1$ CLK 31 that is either a recovered version (via clock recovery, but which is not shown) of the sending $F_1$ (26 of FIG. 2) or is a conditioned version of an explicitly transmitted $F_1$ over a dedicated path (not shown).

The ten-bit parallel output 32 of the Serial To Parallel Converter 30 is applied to a 10b8b Decoder 33, whose output 8 is eight-bit parallel bytes that during normal (non-test) mission mode operation are applied as destination traffic to a Receiving Core Functionality 9. The ten-bit parallel output 32 is also applied to a BSC Decoder 34 whose task it is to recognize those patterns that correspond to a BSC_1 and to a BSC_0. BSC Decoder 34 could include, for example, a register of suitable length (not shown) whose cells are connected to a collection of gates (also not shown) having a single output 35 whose two logical values represent BSC_1 and BSC_0. The one-bit output 35 of BSC Decoder 34 is applied to a Boundary Scan Receive Data Register 36, where it is captured for use by the balance of the boundary scan test mechanism.

BSC Decoder 34 might be responsive to the signal BOUNDARY SCAN TEST 24 if desired, although in the general case that ought not to be necessary. Absent some peculiar reason to the contrary, it causes no harm if the BSC decoding function proceeds without awareness of value of the signal BOUNDARY SCAN TEST 24, since the implication is merely that the B-Scan Receive Data Register 36 is superfluously set or cleared during times when it is of no interest, anyway.

Finally, here are some concluding observations. First, in FIGS. 2 and 3 we have shown the conventional 8b10b Encoder and 10b8b Decoder as being supplemented (selectively supplanted during boundary scan testing) by other mechanisms that supply and decode a BSC__1 and a BSC__0. The advantage of this is that it leaves those existing mechanisms unaltered, easing the task of implementation and minimizing any impact upon collateral issues, such as reliability and performance. An alternate preferred embodiment 41 is shown in FIG. 4.

Figure 4:
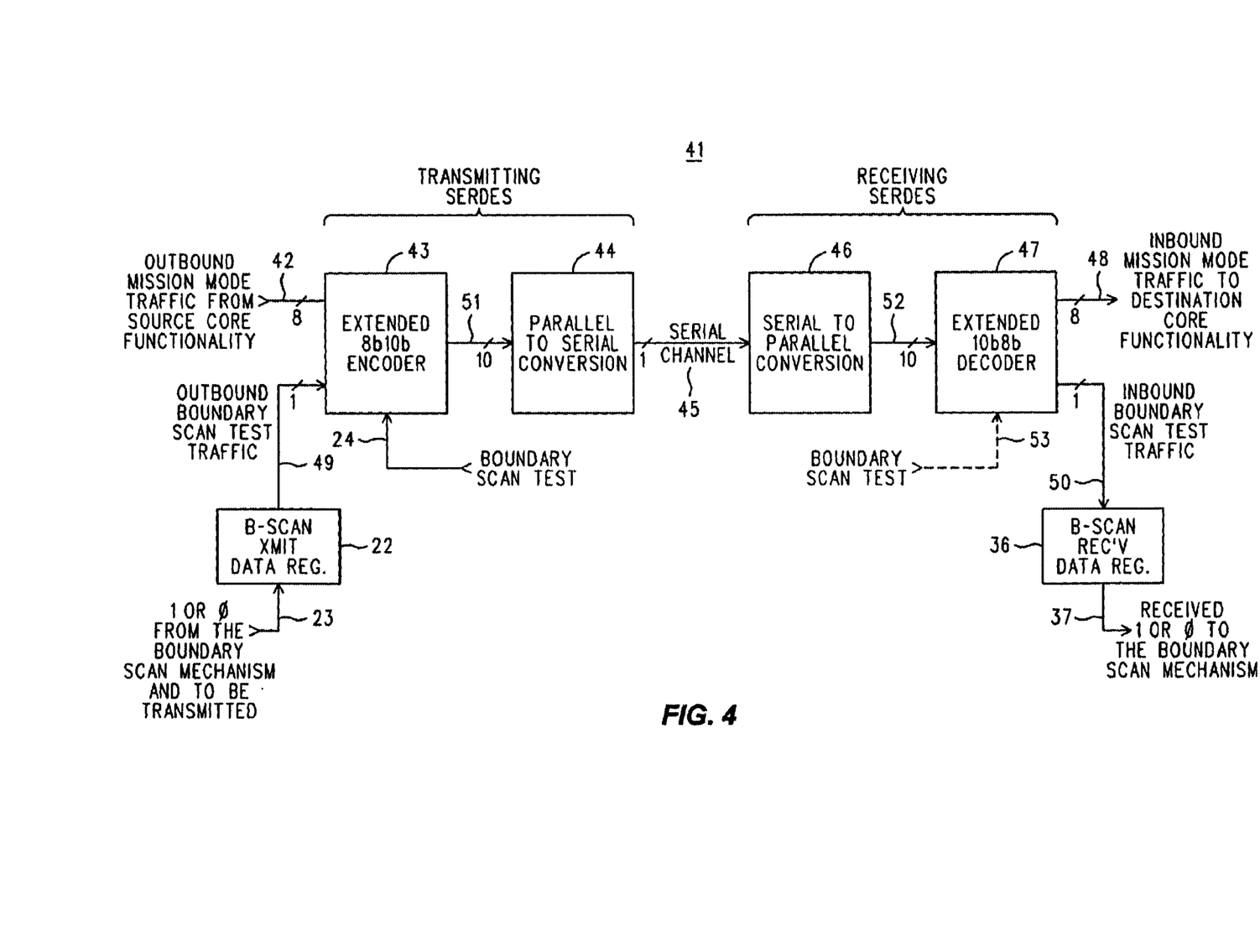
FIG. 4 is a simplified block diagram of an alternate preferred embodiment of the invention.

Referring now to FIG. 4, note that within a Transmitting SERDES both eight-bit Outbound Mission Mode Traffic 42 and Outbound Boundary Scan Test Traffic 49 are applied to an Extended 8b10b Encoder 43, from whence ten-bit parallel patterns 51 are applied to a Parallel To Serial Conversion mechanism 44. Mechanism 43 is responsive to the signal BOUNDARY SCAN TEST 24 by encoding traffic 42 in exactly the manner set out in IEEE 1149.1 when BOUNDARY SCAN TEST is FALSE, and by suitably encoding traffic 49 to be consistent with the description given for BSC__1 and BSC__0 in connection with FIGS. 3 and 4 when BOUNDARY SCAN TEST is TRUE. In turn, mechanism 44 drives a one-bit Serial Channel 45 (which may or may not be AC coupled) ending at a Receiving SERDES having a Serial To Parallel Conversion mechanism 46 whose output 52 is ten-bit parallel patterns that correspond to patterns 51. Patterns 52 are applied to an Extended 10b8b Decoder 47 that: (A) Decodes all Inbound Mission Mode Traffic 48 as specified by IEEE 1149.1; while it also (B) Decodes patterns 52 that have been used to represent BSC__1 and BSC__0 as a logic ONE and a logic ZERO, respectively, to be applied as Inbound Boundary Scan Test Traffic 50 to a B-Scan Received Data Register 36. Registers 22 and 36 are connected to the balance of the boundary scan test circuitry, and otherwise operate, in the same manner as previously described in connection with FIGS. 2 and 3.

We have shown the Extended 8b10b Decoder 47 as being optionally responsive to the signal BOUNDARY SCAN TEST 53. This would seem to be a matter of choice concerning how the Decoder 47 operates internally. The situation is much the same as previously described in connection with the BSC Decoder 34 of FIG. 3: The presence or absence of activity for Inbound Boundary Scan Test Traffic 50 during normal mission mode is probably a non-issue, so long as mission mode traffic 48 is correct during the mission mode and test traffic 50 is correct during the boundary scan test mode.

It should also be noted that our preference for selected frame alignment/disparity equalization character sequences to represent respective alternate meanings is somewhat contingent on the properties of present day SERDES, the use or not of AC coupling in the serial channel, and 8b10b-style encoding. A departure from any one of these could allow the use of single frame alignment characters or even single arbitrary characters, depending upon such issues as tolerance for unequal disparity, etc.

The examples described in this description pertain to a large character set that performs in a conventional manner during a normal mode. The examples have been limited to redefining during an alternate mode a portion of the large character set to transmit and receive a single bit of alternate information not included in the normal definition of the large character set. It is clear that the redefinition mechanism need not be limited to a one single bit of alternate information, but could easily be replicated to convey two or more single-bit quantities, or, that the redefinition mechanism could produce a mapping to one or more two-bit (or three-bit, etc.) quantities of alternate information.

Lastly, we have described a SERDES using a deterministic manner of encoding and decoding for the eight-bit to ten-bit conversion and back again (8b10b/10b8b). First, even for such deterministic approaches, the numbers "eight" and "ten" are merely illustrative. One can contemplate other numbers of bits M-many and N-many, respectively, where N is greater than M. Next, the encoding and decoding mechanism need not be rigidly deterministic. There are statistical methods known (say, using pseudo random sequences generated by linear feedback shift registers) that perform the same function, and that can be used in conjunction with the invention.

We claim:

1. A method of transmitting alternate meanings over a serial communication channel having a multi-bit character set of n-many normal meanings that exclude the alternate meanings, the method comprising the steps of:

(a) transmitting over the serial communication channel, during a normal mode, multi-bit serial bit patterns that correspond to applied traffic of normal meanings using the multi-bit character set;

(b) applying, during an alternate mode, alternate traffic having at least m-many possible alternate meanings;

(c) associating at least a first one of the multi-bit serial bit patterns with a first alternate meaning in the alternate traffic applied in step (b);

(d) associating at least a second one of the multi-bit serial bit patterns with a second alternate meaning in the alternate traffic applied in step (b);

(e) transmitting over the serial communication channel, during the alternate mode, multi-bit serial bit patterns associated by steps (c) and (d) with the alternate traffic applied in step (b);

(f) receiving over the serial communication channel transmitted multi-bit serial bit patterns;

(g) decoding the multi-bit serial bit patterns transmitted in step (e) to determine which of the alternate meanings were in the alternate traffic applied in step (b); and (h) supplying at least one signal representative of an alternate meaning determined in step (g) to alternate circuitry operative during the alternate mode.

2. A method as in claim 1 wherein the alternate mode is boundary scan testing, alternate traffic has alternate meanings of logic ONE and logic ZERO, the multi-bit character set is a character set of parallel bit patterns, and further wherein the associating of steps (c) and (d) each comprise the step of substituting words of normal mode parallel traffic with words of alternate mode parallel traffic corresponding to the at least a first one of the multi-bit serial bit patterns and to the at least a second one of the multi-bit serial bit patterns, and also further comprising the step of converting parallel bit patterns to multi-bit serial bit patterns.

3. A method as in claim 1 wherein the multi-bit serial bit patterns transmitted in step (e) include framing characters.

4. Apparatus for transmitting alternate meanings over a serial communication channel having a multi-bit character set of n-many normal meanings that exclude the alternate meanings, the apparatus comprising:

a serial communication channel having an input and an output;

a first SERDES comprising:

a normal mode encoder having an input coupled to receive normal mode traffic expressed as parallel bit patterns of J-many bits in the multi-bit character set and an output at which are produced corresponding parallel bit patterns of K-many bits, J≦K;

an alternate mode encoder having an input coupled to receive alternate mode traffic of one or more bits expressing the alternate meanings and having an output at which are produced corresponding groups of different sequential instances of parallel bit patterns of K-many bits;

a multiplexer having a first data input coupled to the output of the normal mode encoder, a second data input coupled to the output of the alternate mode encoder, an output, and also having a control input responsive to a signal indicative of which of the normal mode and the alternate mode is in effect, wherein the output of the multiplexer represents the first data input during the normal mode and the second data input during the test mode; and a parallel-to-serial converter having a parallel input coupled to the output of the multiplexer and a serial output coupled to the input of the serial communication channel; and a second SERDES comprising:

a serial-to-parallel converter having an input coupled to the output of the serial communication channel and having an output at which is produced the bit patterns applied to the input of the parallel-to-serial converter of the first SERDES; and an alternate mode decoder coupled to the output of the serial-to-parallel converter and having an output at which appears at least one signal indicative during the alternate mode of the alternate meanings.

5. Apparatus as in claim 4 wherein the normal mode encoder is an 8b10b encoder.

6. Apparatus as in claim 4 wherein the serial channel is AC coupled and the corresponding groups each comprises differing parallel bit patterns of K-many bits that, as a group, have an equal number of ones and zeros.

7. Apparatus for transmitting alternate meanings over a serial communication channel having a multi-bit character set of n-many normal meanings that exclude the alternate meanings, the apparatus comprising:

a serial communication channel having an input and an output;

a first SERDES comprising:

an encoder having a selection input coupled to receive a selection signal indicative of normal and alternate modes of operation, a normal mode traffic input coupled to receive normal mode traffic expressed as parallel bit patterns of J-many bits in the multi-bit character set, an alternate mode traffic input coupled to receive alternate mode traffic of one or more bits expressing the alternate meanings, and also having an output at which are produced corresponding normal groups of different sequential instances of parallel bit patterns of K-many bits when the selection signal indicates the normal mode of operation, and at which are produced corresponding alternate groups of different sequential instances of parallel bit patterns of K-many bits when the selection signal indicates the alternate mode of operation, J≦K;

a parallel-to-serial converter having a parallel input coupled to the output of the encoder and a serial output coupled to the input of the serial communication channel; and a second SERDES comprising:

a serial-to-parallel converter having an input coupled to the output of the serial communication channel and having an output at which is produced the bit patterns applied to the input of the parallel-to-serial converter of the first SERDES; and a decoder having a selection input coupled to the selection signal, a multi-bit input coupled to the output of the serial-to-parallel converter, and also having an output at which appears, during the alternate mode, at least one signal indicative of the alternate meanings.

8. Apparatus as in claim 7 wherein the normal mode encoder is an 8b10b encoder.

9. Apparatus as in claim 7 wherein the serial channel is AC coupled and the corresponding groups each comprises differing parallel bit patterns of K-many bits that, as a group, have an equal number of ones and zeros.

* * * * *